(12) United States Patent
Deng et al.

(10) Patent No.: US 7,879,644 B2
(45) Date of Patent: Feb. 1, 2011

(54) HYBRID WINDOW LAYER FOR PHOTOVOLTAIC CELLS

(75) Inventors: Xunming Deng, Sylvania, OH (US); Xianbo Liao, Toledo, OH (US); Wenhui Du, Toledo, OH (US)

(73) Assignee: The University of Toledo, Toledo, OH (US)

( * ) Notice: Subject to any disclaimer, the term of this patent is extended or adjusted under 35 U.S.C. 154(b) by 275 days.

(21) Appl. No.: 11/899,799

(22) Filed: Sep. 7, 2007

(65) Prior Publication Data
US 2008/0166833 A1    Jul. 10, 2008

Related U.S. Application Data

(62) Division of application No. 10/696,545, filed on Oct. 29, 2003, now Pat. No. 7,667,133.

(51) Int. Cl.
H01L 21/00    (2006.01)
(52) U.S. Cl. .............. 438/96; 438/97; 438/98; 257/E31.126
(58) Field of Classification Search ........... 438/96, 438/97, 98; 257/E31.126
See application file for complete search history.

(56) References Cited

U.S. PATENT DOCUMENTS

| | | |
|---|---|---|
| 3,811,953 A | 5/1974 | Nozik |
| 4,011,149 A | 3/1977 | Nozik |
| 4,090,933 A | 5/1978 | Nozik |
| 4,118,294 A | 10/1978 | Pellegri |
| 4,144,147 A | 3/1979 | Jarrett et al. |
| 4,172,925 A | 10/1979 | Chen et al. |
| 4,215,182 A | 7/1980 | Ang et al. |
| 4,236,984 A | 12/1980 | Grantham |
| 4,310,405 A | 1/1982 | Heller |
| 4,315,973 A | 2/1982 | Manassen et al. |
| 4,316,049 A | 2/1982 | Hanak |
| 4,335,266 A | 6/1982 | Mickelsen et al. |
| 4,385,971 A | 5/1983 | Swartz |
| 4,419,530 A | 12/1983 | Nath |

(Continued)

FOREIGN PATENT DOCUMENTS

JP    362092380    4/1987

(Continued)

OTHER PUBLICATIONS

IPER for WO 2004/049459 (PCT/US03/37733), Dated Feb. 10, 2005, Deng et al.

(Continued)

*Primary Examiner*—Michael Trinh
(74) *Attorney, Agent, or Firm*—MacMillan Sobanski & Todd, LLC

(57) ABSTRACT

A novel photovoltaic solar cell and method of making the same are disclosed. The solar cell includes: at least one absorber layer which could either be a lightly doped layer or an undoped layer, and at least a doped window-layers which comprise at least two sub-window-layers. The first sub-window-layer, which is next to the absorber-layer, is deposited to form desirable junction with the absorber-layer. The second sub-window-layer, which is next to the first sub-window-layer, but not in direct contact with the absorber-layer, is deposited in order to have transmission higher than the first-sub-window-layer.

27 Claims, 6 Drawing Sheets

U.S. PATENT DOCUMENTS

| | | | |
|---|---|---|---|
| 4,419,578 A | 12/1983 | Kress | |
| 4,427,749 A | 1/1984 | Graetzel et al. | |
| 4,451,970 A | 6/1984 | Izu et al. | |
| 4,464,823 A | 8/1984 | Izu et al. | |
| 4,500,744 A * | 2/1985 | Nozaki et al. | 136/258 |
| 4,501,804 A | 2/1985 | Bockris et al. | |
| 4,510,674 A | 4/1985 | Izu et al. | |
| 4,510,675 A | 4/1985 | Izu et al. | |
| 4,511,638 A | 4/1985 | Sapru et al. | |
| 4,528,252 A | 7/1985 | Yamazaki | |
| 4,544,470 A | 10/1985 | Hetrick | |
| 4,598,306 A | 7/1986 | Nath et al. | |
| 4,628,013 A | 12/1986 | Figard et al. | |
| 4,643,817 A | 2/1987 | Appleby | |
| 4,650,554 A | 3/1987 | Gordon | |
| 4,656,103 A | 4/1987 | Reichman et al. | |
| 4,729,970 A | 3/1988 | Nath et al. | |
| 4,785,186 A | 11/1988 | Street et al. | |
| 4,963,508 A | 10/1990 | Umeno et al. | |
| 5,019,227 A | 5/1991 | White et al. | |
| 5,032,884 A | 7/1991 | Yamagishi et al. | |
| 5,055,416 A | 10/1991 | Weber | |
| 5,084,400 A | 1/1992 | Nath et al. | |
| 5,091,886 A | 2/1992 | Miyawaki et al. | |
| 5,107,104 A | 4/1992 | Miyasaka | |
| 5,117,114 A | 5/1992 | Street et al. | |
| 5,131,954 A | 7/1992 | Vogeli et al. | |
| 5,156,979 A | 10/1992 | Sato et al. | |
| 5,320,723 A | 6/1994 | Kawakami | |
| 5,693,947 A | 12/1997 | Morton | |
| 5,859,397 A | 1/1999 | Ichinose et al. | |
| 5,885,725 A * | 3/1999 | Toyama et al. | 429/9 |
| 5,916,678 A | 6/1999 | Jackson et al. | |
| 6,121,541 A * | 9/2000 | Arya | 136/255 |
| 6,132,585 A | 10/2000 | Midorikawa et al. | |
| 6,150,605 A | 11/2000 | Han | |
| 6,153,823 A | 11/2000 | Shiozaki et al. | |
| 6,198,037 B1 | 3/2001 | Nakata | |
| 6,221,685 B1 | 4/2001 | Ichinose et al. | |
| 6,222,115 B1 | 4/2001 | Nakanishi | |
| 6,242,686 B1 * | 6/2001 | Kishimoto et al. | 136/255 |
| 6,309,906 B1 * | 10/2001 | Meier et al. | 438/69 |
| 6,361,660 B1 | 3/2002 | Goldstein | |
| 6,471,834 B2 | 10/2002 | Roe et al. | |
| 6,471,850 B2 | 10/2002 | Shiepe et al. | |
| 6,566,594 B2 | 5/2003 | Sano et al. | |
| 7,271,334 B2 | 9/2007 | Gratzel et al. | |
| 2001/0037824 A1 | 11/2001 | Sano et al. | |
| 2004/0003837 A1 | 1/2004 | Mauk | |
| 2005/0092357 A1 | 5/2005 | Deng | |
| 2005/0205128 A1 | 9/2005 | Deng | |
| 2005/0211290 A1 | 9/2005 | Deng | |
| 2007/0256729 A1 | 11/2007 | Vijh et al. | |
| 2008/0000524 A1 | 1/2008 | Deng | |

FOREIGN PATENT DOCUMENTS

| | | |
|---|---|---|
| JP | 2277592 | 11/1990 |
| JP | 08051227 A | 2/1996 |
| JP | 408051227 | 2/1996 |
| JP | 2000264053 | 9/2000 |
| WO | WO 2004/049459 | 6/2004 |
| WO | WO 2004/050961 | 6/2004 |
| WO | WO 2005/081326 | 9/2005 |
| WO | WO 2005/101510 | 10/2005 |
| WO | WO 2006/110613 | 10/2006 |

OTHER PUBLICATIONS

Written Opinion for WO 2004/050961 (PCT/US03/37543), Dated Oct. 31, 2007, Deng et al.

IPER for WO 2005/081326 (PCT/US05/005121), Dated May 27, 2005, Deng et al.

IPER for WO 2005/101510 (PCT/US05/12777), Dated Oct. 27, 2005, Vijh et al.

IPER for WO 2006/110613 (PCT/US06/013222)—co-pending priority case—, Dated Jan. 17, 2008, Adiga et al.

Miller, E.L.; Rocheleau, R.E., Deng, X.M., Design considerations for a hybrid amorphous silicon/photoelectrochemical multi junction cell for hydrogen production, Int. J. Hydrogen Energy, 28(6), 2003, 615-623.

Bak, T.; Nowotny, J.; Rekas, M.; Sorrell, C.C., Photo-electrochemical hydrogen generation from water using solar energy, Materials-related aspects, Int. J. Hydrogen Energy, 27 (10), 2002, 991-1022.

Ohmori, T.; Go, H.; Yamaguchi, N.; Nakayama, A.; Mametsuka, H.; Suzuki, E., Photovoltaic water electrolysis using the sputter-deposited a-Si/c-Si solar cells, Int. J. Hydrogen Energy 26 (7), 2001, 661-664.

Ulleberg, O., Modeling of advanced alkaline electrolyzers: a system simulation approach, Int. J. Hydrogen Energy, 28(1), 2003, 21-33.

El-Shatter, Th.F., Eskandar, M.N., El-Hagry, M.T., Hybrid PV/fuel cell system design and simulation, Renewable Energy 27(2002) 479-485.

Hollmuller, P., Joubert, J-M., Lachal, B., Yvon, K., Evaluation of a 5 $kW_p$ photovoltaic hydrogen production and storage installation for a residential home in Switzerland, Int. J. Hydrogen Energy, 25 (2) 2000, 97-109.

Abaoud, H., Steeb, H., The German-Saudi HYSOLAR Program, Int. J. Hydrogen Energy, 23(6) 1998, 445-449.

Szyszka, A., Ten years of solar hydrogen demonstration project at Neunburg Vorm Wald, Germany, Int. J Hydrogen Energy, 23(10), 1998, 849-860.

Bolton, J.R., Solar photoproduction of hydrogen: a review, Solar Energy, 57, 37-50 (1996).

Kocha, S.S., Montgomery, D., Peterson, M.W., Turner, J.A., Photoelectrochemical decomposition of water utilizing monolithic tandem cells, Solar Energy Materials & Solar Cells, 52, 389-397 (1998).

Licht, S., Efficient solar generation of hydrogen fuel—a fundamental analysis, Electrochemistry Communications 4, 790-795 (2002).

Shukla, P.K., Karn, R.K., Singh, A.K., Srivastava, O.N., Studies on PV assisted PEC solar cells for hydrogen production through photoelectrolysis of water, Int. J. of Hydrogen Energy, 27, 135-141 (2002).

Gao. X., Kocha, S., Frank, A.J., Turner, J.A., Photoelectrochemical decomposition of water using modified monolithic tandem cells, Int. J. of Hydrogen Energy, 24, 319325 (1999).

Rocheleau, R.E., Miller, E.L., Photoelectrochemical production of hydrogen: Engineering loss analysis, Int. J. Hydrogen Energy, 22, 771-782 (1997).

Perez-Mendez, V., Morel, J., Kaplan, S. N., Street, R. A., Detection of Charged Particles in Amorphous Silicon Layers, Nuclear Instruments and Methods in Physics Research, 252, 478-482 (1986).

Hong, W.S., Mireshghi, A., Drewery, J.S., Jing, T., Kitsuno, Y., Lee, H., Kaplan, S.N., Perez-Mendez, V., Charged Particle Detectors Based on High Quality Amorphous Silicon Deposited with Hydrogen or Helium Dilution of Silane, IEEE Transactions on Nuclear Science, 42(4), Aug. 1995, p. 240-246.

Holcomb, D. E., Wintenburg, A., Deng, X.M., Pixelated Neutron Beam Monitor Development, Proc. of International Workshop on position-sensitive detectors, held at Hahn-Meitner-Institut, Berlin, Germany, Jun. 28-30 (2001).

Deng, X.M., Jones, S.J., Liu, T., Izu, M., Ovshinsky, S.R., Improved μc-Si p-layer and a-Si i-layer materials using VHF plasma deposition, in Conference Record of the Twenty Sixth IEEE Photovoltaic Specialists Conference—1997, p. 591-594 (1997).

Wang, W., Povolny, H.S., Du, W., Liao, X.B., Deng, X.M., Triple-Junction a-Si Solar Cells with Heavily Doped Thin Interface Layers at the Tunnel Junctions, in Proc. of IEEE 29$^{th}$ Photovoltaic Specialist Conference, 2002.

Povolny, H. S., Deng, X.M., High Rate Deposition of Amorphous Silicon Films Using HWCVD With a Coil-Shaped Filament, Thin Solid Films, vol. 430, 125-129 (2003).

Roussillon, Y.; Giolando, D. M.; Shvydka, D.; Compaan, A. D.; Karpov, V. G., Blocking thin-film nonuniformities: Photovoltaic self-healing, Applied Physics Letters, vol. 84, Issue 4, Jan. 26, 2004, 616-618.

Kymakis, E., Alexandrou, I., Amaratunga, G.A.J., High open-circuit voltage photovoltaic devices from carbon-nanotube-polymer composites, J. Application. Phys. 93 (3), 1764-1768 (2003).

Pratima Agarwal, Povolny, H., Han, S., Deng, X.M., Study of SiGe:H Films and n-i-p Devices used in High Efficiency Triple Junction Solar Cells, J. Non-Crystalline Solids, (20002) vol. 299-302-,pp. 1213-1218.

Pratima Agarwal et al. Study of a-SiGe:H Films and n-i-p Devices used in High Efficiency Triple Junction Solar Cells; J. of Non-Cystalline Solids (2002) vol. 299-302 pp. 1213-1218.

E. Kymakis et al., "High open-circuit voltage photovoltaic devices from carbon-nanotube-polymer composites" J. Appl. Phys. 93 (3), 1764-1768. (2003).

Liao et al.; AMPS Modeling of Nanocrystalline Si P-Layer in a-Si NIP Solar Cells; 29th annual IEEE photovoltaics conference 2002, New Orleans, LA, May 19-24, 2002; pp. 1234-1237.

W. Ma et al, "The Utilization of Microcrystalline Si and SiC for Efficiency Improvement in a-Si Solar Cells," Conf. Rec. of the 24th IEEE Photovoltaic Specialists Conference, vol. 1, p. 417-420, (1994).

* cited by examiner

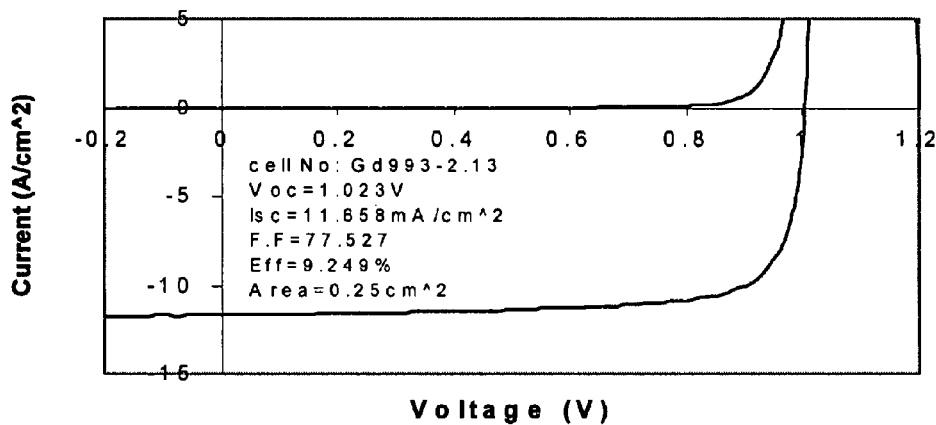
Fig. 1a
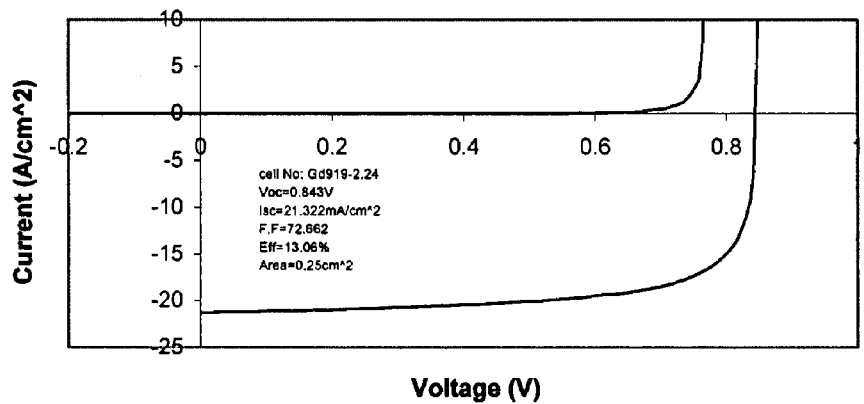
Fig. 4a
| Sample | $t_1$ (min) | $t_2$ (min) | Voc | Jsc | FF | η |
|---|---|---|---|---|---|---|
| No | 140C | 70C | (V) | (mA/cm2) | (%) | (%) |
| GD904 | 3 | 0 | 0.856 | 20.6 | 68.6 | 12.1 |
| GD907 | 0 | 3 | 0.856 | 20.7 | 65.9 | 11.7 |
| GD908 | 0.5 | 2 | 0.858 | 21.0 | 66.9 | 12.1 |
| GD919 | 1 | 2 | 0.847 | 21.5 | 70.1 | 12.8 |
Fig. 5a

I-V curve of solar cells with p-layer deposit at 70 C

I-V curve of solar cells with p-layer deposit at 140 C

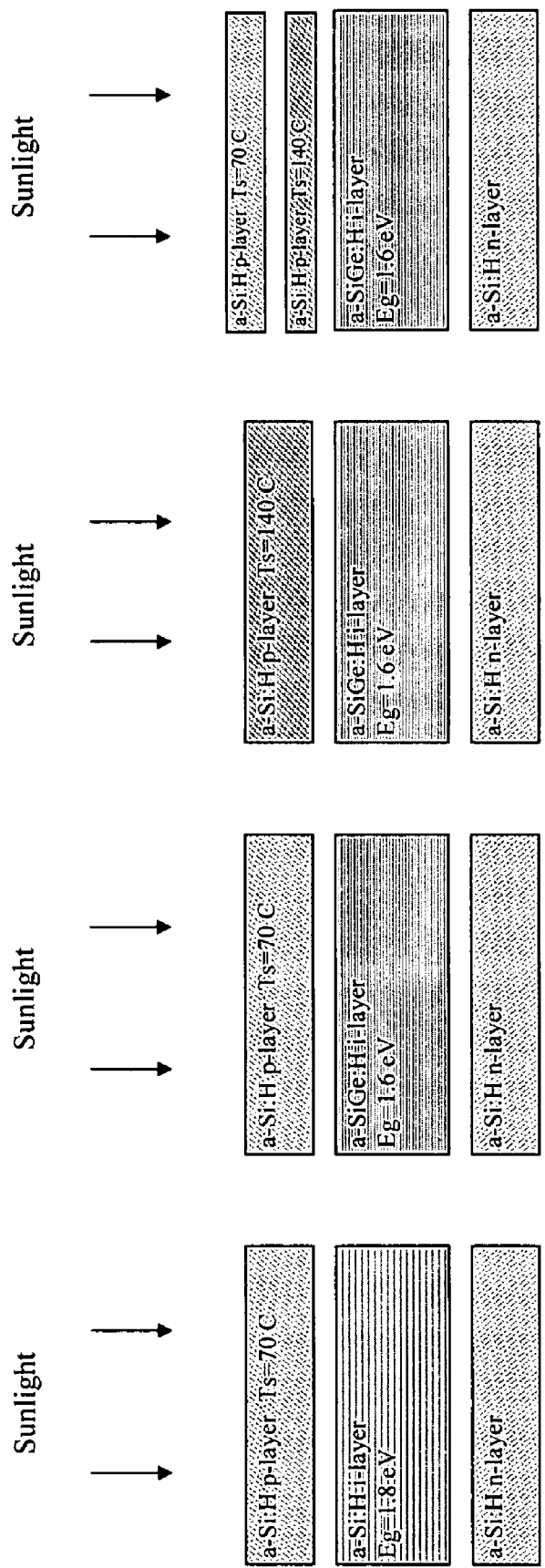

Deposition Conditions for GD904, GD907, GD908, GD919

| | n-layer | | | | | | | | i-layer | | | | | | | | | p-layer | | | | | | | |
|---|---|---|---|---|---|---|---|---|---|---|---|---|---|---|---|---|---|---|---|---|---|---|---|---|---|
| | Pressure (Torr) | RF power (Watt) | Temp (C) | SiH4 (sccm) | PH3 (sccm) | H2 (sccm) | time (min) | | Pressure (Torr) | RF power (Watt) | Temp (C) | Si2H6 (sccm) | GeH4 (sccm) | H2 (sccm) | time (min) | | Pressure (Torr) | RF power (Watt) | Temp (C) | SiH4 (sccm) | BF3 (sccm) | H2 (sccm) | time (min) |
| GD904 | 0.5 | 3 | 300 | 2.5 | 0.5 | 50 | 0.16 | | 0.6 | 3.5 | 300 | 2 | | 100 | 2.5 | | 2 | 100 | 140 | | | 100 | 1 |
| | | | | 2.5 | 0.125 | 50 | 2.5 | | | | | 2 | 0.55 | 100 | 60 | | | | | 0.3 | 0.1 | 100 | 3 |
| | | | | | | | | | | | | 2 | | 100 | 5 | | | | | 0.3 | 1 | 100 | 0.16 |
| GD907 | 0.5 | 3 | 300 | 2.5 | 0.5 | 50 | 0.16 | | 0.6 | 3.5 | 300 | 2 | | 100 | 2.5 | | 2 | 100 | 140 | | | 100 | 1 |
| | | | | 2.5 | 0.125 | 50 | 2.5 | | | | | 2 | 0.55 | 100 | 40 | | 2 | 100 | 70 | 0.3 | 0.1 | 100 | 3 |
| | | | | | | | | | | | | 2 | | 100 | 5 | | 2 | 100 | 70 | 0.3 | 1 | 100 | 0.16 |
| GD908 | 0.5 | 3 | 300 | 2.5 | 0.5 | 50 | 0.16 | | 0.6 | 3.5 | 300 | 2 | | 100 | 2.5 | | 2 | 100 | 140 | | | 100 | 1 |
| | | | | 2.5 | 0.125 | 50 | 2.5 | | | | | 2 | 0.55 | 100 | 60 | | 2 | 100 | 140 | 0.3 | 0.1 | 100 | 0.5 |
| | | | | | | | | | | | | 2 | | 100 | 5 | | 2 | 100 | 70 | 0.3 | 0.1 | 100 | 2 |
| | | | | | | | | | | | | | | | | | 2 | 100 | 70 | 0.3 | 1 | 100 | 0.16 |
| GD919 | 0.5 | 3 | 300 | 2.5 | 0.5 | 50 | 0.16 | | 0.6 | 3.5 | 300 | 2 | | 100 | 2.5 | | 2 | 100 | 140 | | | 100 | 1 |
| | | | | 2.5 | 0.125 | 50 | 2.5 | | | | | 2 | 0.55 | 100 | 60 | | 2 | 100 | 140 | 0.3 | 0.1 | 100 | 1 |
| | | | | | | | | | | | | 2 | | 100 | 5 | | 2 | 100 | 70 | 0.3 | 0.1 | 100 | 2 |
| | | | | | | | | | | | | | | | | | 2 | 100 | 70 | 0.3 | 1 | 100 | 0.16 |

Fig. 5c

HYBRID WINDOW LAYER FOR PHOTOVOLTAIC CELLS

CROSS-REFERENCE TO RELATED APPLICATIONS AND STATEMENT REGARDING SPONSORED RESEARCH

The present invention is a divisional application of the patent application Ser. No. 10/696,545 filed Oct. 29, 2003 now U.S. Pat. No. 7,667,133.

This invention was made with Government support under National Renewable Energy Laboratory (NREL) contract No. NDJ-1-30630-08 awarded by the Department of Energy. The government has certain rights in this invention.

TECHNICAL FIELD

The present invention relates to a novel doped window layer and photovoltaic solar cells containing the same.

BACKGROUND OF THE INVENTION

Solar cells rely on the semiconductor junction to convert sunlight into electricity. The junction consists at least of two layers of opposite types one layer being an n-layer with an extra concentration of negatively charged electrons and the other layer being a p-layer with an extra concentration of positively charged holes. There is at least a window layer, which is usually heavily doped and an absorber layer, which is either a lightly doped or undoped semiconductor. In solar cells, only photons that are near or above the semiconductor bandgap of the absorber layer can be absorbed and utilized. In the solar radiation, there is a limited amount of flux of photons with energy above such a value. Unfortunately, all photons will have to pass through the doped window layer before the photons reach the absorber layer. Those photons absorbed by the window layer will not be able to be converted into useful electricity and are wasted. One way to reduce such an absorption is to make the doped window layer with a wider bandgap and to make the doped window layer very thin. However, a minimum thickness is required for the doped window layer in order to maintain build-in potential. When the bandgap of the window layer is increased beyond the absorber layer, there is a mismatch in the band edge at the junction. Such a mismatch at the band edge prevents carriers, electrons or holes, to flow smoothly and get collected, which then results in poor solar cell performance, as represented often by a "roll-over" or "double-diode" effect in the current-voltage (I-V) characteristics.

As a specific example of the problem, single-junction hydrogenated amorphous silicon (a-Si) based solar cells could be fabricated. In these a-Si based solar cell (including solar cells based on a-SiGe:H alloys), the absorber layer is sandwiched between two doped layers which generate an electrical field over the intrinsic layer (i-layer). Either the n-type doped layer or the p-type doped layer could serve as the window layer, which is on the side the sunlight enters. However, due to the fact the hole mobility is much smaller than the electron mobility in a-Si based materials, the p-layer is often used as the window layer so that holes, having smaller mobility compared with electrons, will need to travel less distance to get collected. For this reason, the properties of the p-layer must meet several, often conflicting, requirements. The p-layer must have a wider bandgap so that sunlight can pass through the p-layer without being absorbed before reaching the intrinsic layer (absorber layer in this case) for the photon to electricity conversion. On the other hand, this p-layer must not have a bandgap wider than the i-layer since there would be a mismatch in the band edge at the p-i interface.

In order to make a single-junction solar cell with higher efficiency, it is desirable to reduce the bandgap of the absorber layer, for example by using alloys having a small amount (about 10-30%) of germanium. Earlier work by the inventor found that the a-SiGe solar cells with about 10-30% Ge in the i-layer is more stable after prolonged exposure in the sun. The p-layer for such a lower bandgap a-SiGe absorber layer needs to have a smaller bandgap so that the p-layer can form a smooth interface with the lower-bandgap a-SiGe i-layer while at the same time the p-layer needs to have a wider bandgap to have minimized absorption.

The problems and difficulties represented here for single-junction a-SiGe solar cell apply also to a broader range of solar cells that have at least a doped window layer and a lightly doped or undoped absorber layer.

Therefore, there is a need to design a novel window layer that overcomes most, if not all, of the preceding problems.

SUMMARY OF THE INVENTION

In one aspect, the present invention relates to a novel photovoltaic solar cell comprising: at least one absorber layer, and at least one doped window layer having at least two sub-layers. The first sub-window-layer is adjacent the absorber layer and forms a desirable junction with the absorber-layer and the second sub-window-layer is adjacent the first sub-window-layer and has high optical transmission. In certain embodiments, the second sub-window-layer has a transparency greater than the transparency of the first sub-layer.

In certain aspects, the photovoltaic cell comprises an thin film silicon (tf-Si) alloy based solar cell including at one of amorphous silicon (a-Si:H) based solar cell, nanocrystalline silicon (nc-Si:H) based solar cell, microcrystalline silicon (μc-Si:H) based solar, polycrystalline silicon (poly-Si:H) based solar cell, or other combinations and mixtures. In certain specific aspects, the photovoltaic cell comprises an amorphous silicon alloy based solar cell such as, for example, at least one of a-Si:H, a-$Si_{(1-x)}Ge_x$:H and other combinations and mixtures.

The doped window-layer can comprises a p-type layer or an n-type layer and be formed using vapor phase deposition, such as for example, plasma enhanced chemical vapor deposition. The desirable deposition conditions are achieved by varying parameters including at least one of the following: temperature, composition of gas mixtures, rf power, pressure, reactor geometry and dilution with gases such as hydrogen.

The solar cell can further comprise one or more of the following: a substrate selected from at least one of: glass, metal or plastic; a suitable transparent conductive oxide layer adjacent the second sub-window-layer; an encapsulation layer overlaying the solar cell to provide a substantially airtight and watertight protective barrier against moisture and contaminants; and/or a buffer semi-conductor layer between the absorber-layer and the first sub-window-layer. In certain embodiments, the absorber layer is the i-layer for a-Si solar cells; and, for other solar cells, such as crystalline silicon solar cells, the absorber layer is a lightly doped layer.

In another aspect, the present invention relates to a method for manufacturing a solar cell comprising the steps of: (i) providing a substrate; (ii) depositing semiconductor layers that comprise at least an absorber layer and at least one doped-window-layer, wherein the doped window layer comprises at least two-sub-window-layers deposited under desirable deposition conditions; and, (iii) depositing a layer of transparent conducting oxide next to the doped-window-layer but not in direct contact with the absorber-layer. In certain embodiments, the first sub-window-layer is adjacent to the absorber layer and is deposited under conditions which achieve a desirable junction with the absorber-layer; and in which the second sub-window-layer is adjacent the first sub-window-layer but not directly in contact with the absorber-layer and is deposited under conditions which achieve high optical transmission.

The doped window layer can be deposited before or after the deposition of the semiconductor absorber layer. In certain embodiments, the absorber layer contains silicon and germanium and during the absorber-layer deposition, an optimized ratio of germanium-containing gas and silicon-containing gas provides a Ge content suitable for forming a high efficiency single-junction solar cell. The first and second sub-window-layers are deposited by a vapor phase deposition process such as, for example, by chemical vapor deposition including radio frequency plasma enhanced chemical vapor deposition. The plasma enhanced chemical vapor deposition can be by at least one of the following: cathodic direct current glow discharge, anodic direct current glow discharge, radio frequency glow discharge, very high frequency (VHF) glow discharge, alternate current glow discharge, or microwave glow discharge.

In certain aspects, the first and second window-layers amorphous silicon-containing material are selected from: hydrogenated amorphous silicon, hydrogenated amorphous silicon carbide, and hydrogenated amorphous silicon germanium, as well as the mixtures and combinations of the above. In certain embodiments, the first and second window-layers silicon-containing material are selected from: a-Si:H, a-Si$_{1-x}$C$_x$:H, a-Si$_{1-x}$Ge$_x$:H, nc-Si:H, nc-Si$_{1-x}$C$_x$:H, nc-Si$_{1-x}$Ge$_x$:H, μc-Si:H, μc-Si$_{1-x}$C$_x$:H, μc-Si$_{1-x}$Ge$_x$:H, as well as mixtures and combinations of the above.

Further, in certain specific embodiments, the present invention is directed to a photovoltaic solar cell comprising: at least one n-type layer, at least one i-type layer, and at least two sub-p-layers. The first sub-p-layer, which can also be considered as an interface p-layer, is deposited at a desired first temperature next to the i-type layer and a second sub-p-layer is deposited next to the first sub-p-layer at a desired second temperature which is lower than the first temperature at which the first sub-p-layer is deposited. The first sub-p-layer is deposited next to the i-type layer at a temperature sufficiently high to form a good junction with the i-layer. In certain preferred embodiments, the first sub-p-layer is deposited at about 140° C.

The second sub-p-layer has a transparency greater than the transparency of the first sub-p-layer. The second sub-p-layer is deposited at a temperature sufficient low to provide acceptable transparency. In certain embodiments, the second sub-p-layer is deposited at or below a temperature of about 70° C.

The first and second p-layers amorphous silicon-containing material are generally selected from the group including hydrogenated amorphous silicon, hydrogenated amorphous carbon, and hydrogenated amorphous silicon germanium. In certain embodiments, the i-layer comprises hydrogenated amorphous silicon germanium having a bandgap ranging from about 1.4 e-V to about 1.6 e-V and wherein the first and second sub p-layers comprise amorphous silicon with a bandgap of 1.6 eV.

Also, in certain embodiments, the first sub-p-layer has a thickness in the range of about 0.001 micron to about 0.004 micron and the second sub-p-layer has a thickness in the range of about 0.005 micron to about 0.02 micron. It is to be understood that in certain embodiments, the first sub-p-layer is thinner than the second sub-p-layer.

The solar cell made using the hybrid sub p-layers has a conversion efficiency of about 10% or greater. Such solar cell can include a suitable substrate such as a glass, metal or plastic, and can further include a suitable transparent conductive oxide layer adjacent the second sub-p-layer. The transparent conductive oxide layer can comprise, for example, indium-tin-oxide (ITO) deposited at a temperature sufficiently low to avoid damaging the second sub-p-layer. It is further to be understood that the solar cell can further comprise an encapsulation layer overlaying the cell to provide a substantially air tight and water tight protective barrier against moisture and contaminants.

Also, in certain embodiments, the solar cell can further comprise a buffer semi-conductor layer between the n-layer and the i-layer and between the i-layer and the first sub-p-layer.

Various materials are especially useful in the present invention. For example, the first and second p-layers can comprise an amorphous silicon-containing material; the i-layer can comprise amorphous silicon germanium; and the n-layer can comprise amorphous silicon.

In another aspect, the present invention relates to a method for manufacturing a solar cell comprising the steps of
(i) providing a substrate;
(ii) depositing a layer of n-type semi-conductor on the substrate at a temperature sufficiently low to avoid damage or melting the substrate;
(iii) depositing an i-layer on the n-layer at a temperature sufficiently low to avoid melting or damaging the n-layer;
(iv) depositing a first sub-p-layer on the i-layer at a temperature sufficiently high to form a good junction with the i-layer; and
(v) depositing a second sub-p-layer on the first sub-p-layer at a temperature lower than the first temperature at which the first sub-p-layer is deposited.

In certain embodiments, the method can further include depositing a layer of a transparent conductive oxide on the second p-layer. Also a current collection layer can be deposited onto the substrate prior to deposition of the n-layer onto the substrate.

In certain embodiments, the deposition sequence of the layers can be as following:
(i) providing a substrate;
(ii) depositing a second sub-p-layer on the substrate at a temperature relatively low for improved transparency of the p-layer;
(iii) depositing a first sub-p-layer on the second sub-p-layer at a relatively higher temperature to form a good junction with the i-layer to be deposited;
(vi) depositing an i-layer on the first sub-p-layer at a temperature sufficiently low to avoid melting or damaging the p-layer; and
(v) depositing a layer of n-type semi-conductor on the substrate at a temperature sufficiently low to avoid damage or melting the p and i-layers.

In certain embodiments, during the i-layer deposition step, an optimized GeH$_4$ to Si$_2$H$_6$ ratio is used to provide a Ge content suitable for forming a high efficiency single-junction solar cell. Still further, in certain embodiments, an optimized level of hydrogen dilution is used to form the i-layer. Appropriate level of hydrogen dilution of process gases improves the structural order and photovoltaic quality of amorphous silicon based materials.

In certain embodiments, the first and second sub-p-layers are deposited by a suitable chemical vapor deposition process such as a plasma enhanced chemical vapor deposition. The plasma enhanced chemical vapor deposition can be by at least one of the following: cathodic direct current glow discharge, anodic direct current glow discharge, radio frequency glow discharge, very high frequency (VHF) glow discharge, alternate current glow discharge, or microwave glow discharge at a pressure ranging from about 0.2 to about 3 TORR with a dilution ratio of dilutant to feedstock (deposition gas) ranging from about 5:1 to about 200:1.

In yet another aspect, the present invention relates to a method for manufacturing a solar cell comprising the steps of:
  (i) providing a transparent substrate;
  (ii) depositing a transparent conducting oxide layer on the substrate;
  (iii) depositing a second sub-p-layer on the substrate at a temperature relatively low for improved transparency of the second sub p-layer;
  (iv) depositing a first sub-p-layer on the second sub-p-layer at a relatively higher temperature to form a good junction with an i-layer to be deposited thereon;
  (v) depositing the i-layer on the first sub-p-layer at a temperature sufficiently low to avoid melting or damaging the p-layer; and
  (vi) depositing a layer of n-type semi-conductor on the substrate at a temperature sufficiently low to avoid damage or melting the p and i-layers.

Other objects and advantages of the present invention will become apparent to those skilled in the art upon a review of the following detailed description of the preferred embodiments and the accompanying drawings.

BRIEF DESCRIPTION OF THE DRAWINGS

FIG. 1a is a J-V graph showing an amorphous silicon with relatively wide bandgap (WBG) top cell having a high performance ($V_{oc}$=1.023V and FF fill factor 77.5%) obtained using a p-layer deposited at a temperature of 70° C. Such a p-layer forms an ideal junction with a WBG i-layer.

FIG. 1b is a schematic illustration of amorphous silicon WBG top cell described in FIG. 1a.

FIG. 2b is a schematic illustration of the type amorphous silicon top cell described in FIG. 2a.

FIG. 3b is a schematic illustration of the type amorphous silicon top cell described in FIG. 3a.

FIG. 4a is a J-V graph showing a hybrid p-layer for a single-junction medium bandgap a-SiGe cell which forms a good interface with the a-Si i-layer and is more transparent than the material shown in FIGS. 3a and 3b.

FIG. 4b is a schematic illustration of the type amorphous silicon top cell described in FIG. 4a.

FIG. 5a is a table for comparative material A, comparative material B, Example 1 of the present invention, and Example 2 of the present invention showing the open circuit voltage ($V_{oc}$), the short circuit current ($J_{sc}$), the fill factor (FF) and the version efficiency ($\eta$).

FIG. 5c is a table showing the deposition conditions for comparative material A(GD904), comparative material B (GD907), Example 1 (GD908), and Example 2 (GD919).

DETAILED DESCRIPTION OF THE PREFERRED EMBODIMENTS

Figure 2A:
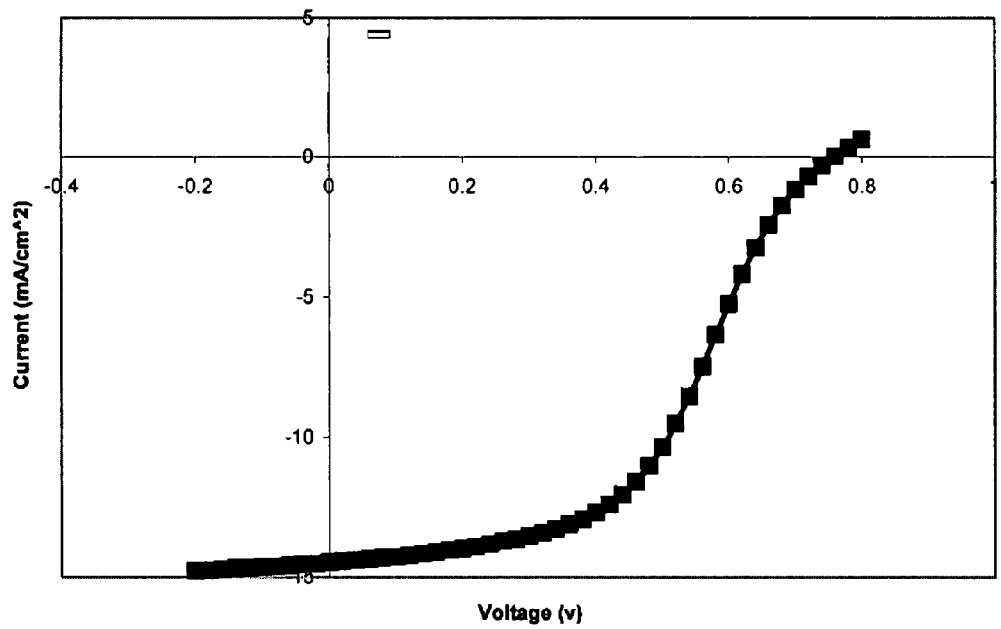
FIG. 2a is a J-V graph showing an amorphous silicon top cell having a p-layer comprising nc-Si, a-Si or a mixed of both phases used for Narrow bandgap a-SiGe solar cells where severe rollover occurs in the J-V curve, possibly due to a mismatch at the p-i interface.

The present invention relates to a novel p-layer in single-junction amorphous silicon and silicon germanium alloy photovoltaic elements. The p-layer of the present invention, when incorporated into solar cells, provides single-junction solar cells with greater than about 12% initial efficiency and greater than about 10% stabilized efficiency. The solar cells with the p-layer of the present invention exhibit efficiencies that previously could only be achieved using multi-junction solar cells structure such as a triple-junction structure. The solar cells of the present invention have only ⅓ of the junctions compared with the triple-junction solar cell and, therefore, can be fabricated with significantly lower costs in terms of capital, labor and materials.

The p-layer of the present invention comprises a hybrid p-layer that comprises at least two adjacent sub p-layers. A first sub p-layer is deposited at a desired first temperature and a second sub p-layer is deposited at another desired second temperature. In this way, the first sub p-layer, or interface region, forms a good junction with a suitable i-layer, such as an amorphous silicon germanium (a-SiGe) absorber layer. The second sub p-layer is highly transparent, thus allowing more sunlight to reach the semi-conductor absorber layer.

In certain embodiments, the second sub p-layer has a thickness that is at least as thick as, an in certain embodiments, thicker than the first sub p-layer. Also, in certain embodiments, the ratio of thicknesses of first sub p-layer to second sub p-layer is about 1:1 to about 1:3. In certain embodiments, the first sub p-layer is formed to a thickness on the order of 2 nm and in certain embodiments, preferably less than 4 nm and the second sub p-layer is formed to a thickness on the order of 10 nm, preferably less than 20 nm.

It is also to be understood that the thickness of the first and second sub p-layers can be adjusted to maximize efficiency and equalize the current generated in each layer. Further, it is to be understood that the solar cells can have the bandgap of the amorphous silicon layers varied by adjusting the hydrogen concentration in the amorphous silicon layers.

The present invention provides a significant improvement in the solar cell conversion efficiency of a low cost amorphous silicon based thin film solar cell. With only ⅓ of the junctions needed for a triple-junction solar cell, the devices using the solar cell of the present invention can be fabricated at low costs yet with approximately the same efficiency, thereby resulting in significant cost savings.

According to one embodiment, the present invention provides high efficiency, single-junction p-i-n a-SiGe photovoltaic material deposited on a suitable substrate to form a solar cell. The solar cell is formed by depositing the p-i-n a-SiGe photovoltaic material onto a substrate such as stainless steel, with or without textured ZnO/Ag or Zn/Al back reflector by using a suitable deposition process such as radio frequency plasma enhanced chemical vapor deposition (Rf PECVD). According to another aspect of the present invention, there is provided a method for making such solar cells which includes: using an optimized $GeH_4$ to $Si_2H_s$ ratio during the i-layer deposition which leads to a Ge content especially suited for high efficiency single-junction a-SiGe cells; using an optimized level of hydrogen dilution for the i-layer; and providing an improved hybrid p-layer which forms an optimized interface between the p-layer and the a-SiGe i-layer.

FIGS. 1a 1b, 2a, 2b, 3a, and 3b show schematic illustrations and data for currently used photovoltaic materials and, in particular, the effect of various types of p-layers on single-junction a-SiGe solar cells. FIGS. 1a and 1b relate to a solar cell structure having an amorphous silicon WBG top cell with a high performance ($V_{OC}$=1.023 v and FF (Fill Factor) =77.5% with a a-Si:H based p-layer deposited at a temperature of 70° C.

FIGS. 2a and 2b relate to the same a-Si:H based p-layer used for NGB a-SiGe deposited at 70° C., showing a severe roll-over which occurs in the J-V curve and which is believed to be due to a band edge mismatch at the p-i interface.

Figure 3A:
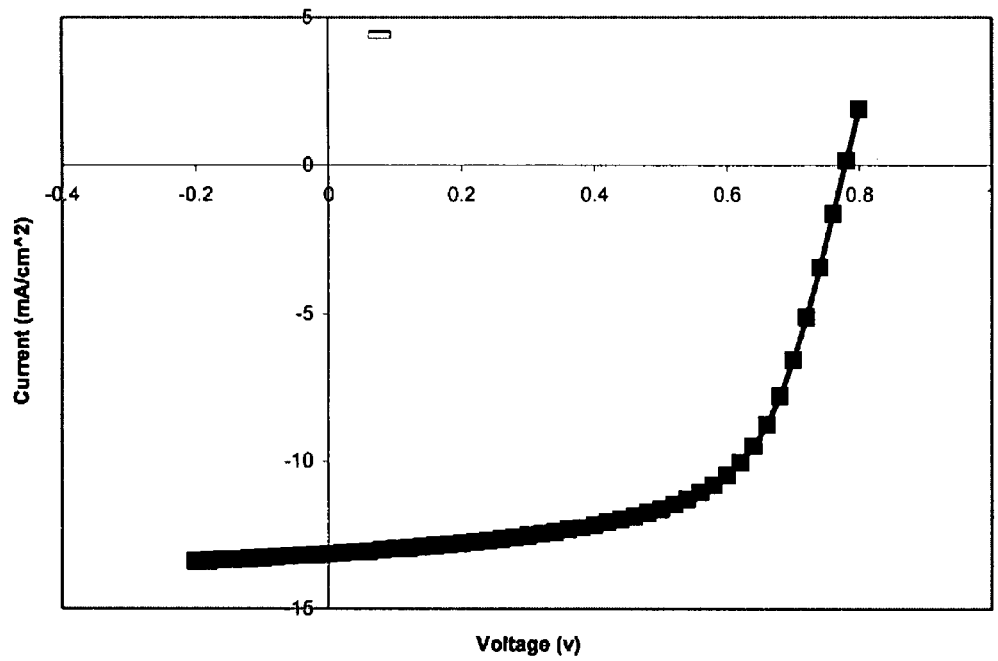
FIG. 3a is a J-V graph of a nc-Si/a-Si layer deposited at a higher temperature of 140° C. which forms a good interface with the NBG a-SiGe i-layer and leads to an ideal J-V curve. The diode characteristics of this material are better than that of the material shown in FIG. 1a. While the p-layer of the FIG. 3a material is less transparent than the p-layer of the material shown in FIG. 1a, such material is yet acceptable for a middle and bottom cell for in a triple stack. This material, however, would not be acceptable for use in any single-junction a-SiGe solar cells

FIGS. 3a and 3b relate to a solar cell where the p-layer is deposited at a higher temperature of about 140° C. Such p-layer forms a good interface with the NBG a-SiGe I-layer which, in turn, leads to a desired J-V curve. However, the p-layer which is deposited at 140° C. is less transparent than the p-layer deposited at 70° C. Such high-temperature deposited p-layers are acceptable for middle and bottom cells in a triple junction solar cell. However, such high-temperature deposited p-layer is not acceptable for use in any single-junction solar cells.

Referring now to FIGS. 4a and 4b, a schematic illustration of a hybrid p-layer for a single-junction medium bandgap solar cells according to the present invention is shown. The hybrid p-layer forms a good interface with the i-layer and has a desirable transparency.

FIG. 4a is a graph showing the high efficiency a-SiGe cell having an initial efficiency of about 13% for the a-SiGe single-junction cell and a stabilized efficiency of about 10.4% after 1000 hours of one sunlight soaking.

FIG. 5a is a table for comparative material A (gd904), comparative material B (gd907), Example 1 of the present invention(gd908), and Example 2 of the present invention (gd919) showing the open circuit voltage ($V_{oc}$), the short circuit current ($J_{sc}$), the fill factor (FF) and the conversion efficiency ($\eta$). Both the Example 1 and the Example 2 show favorable fill factor data and conversion efficiency. It is to be understood that the length of time of the deposition of each sub p-layer can range from about 0.25 to about 3 minutes and, in certain embodiments, from about 0.5 to about 2 minutes. The deposition rate for the p-layers shown in FIG. 5a is about 0.05 nm/sec, or 3 nm/min.

Figure 5B:
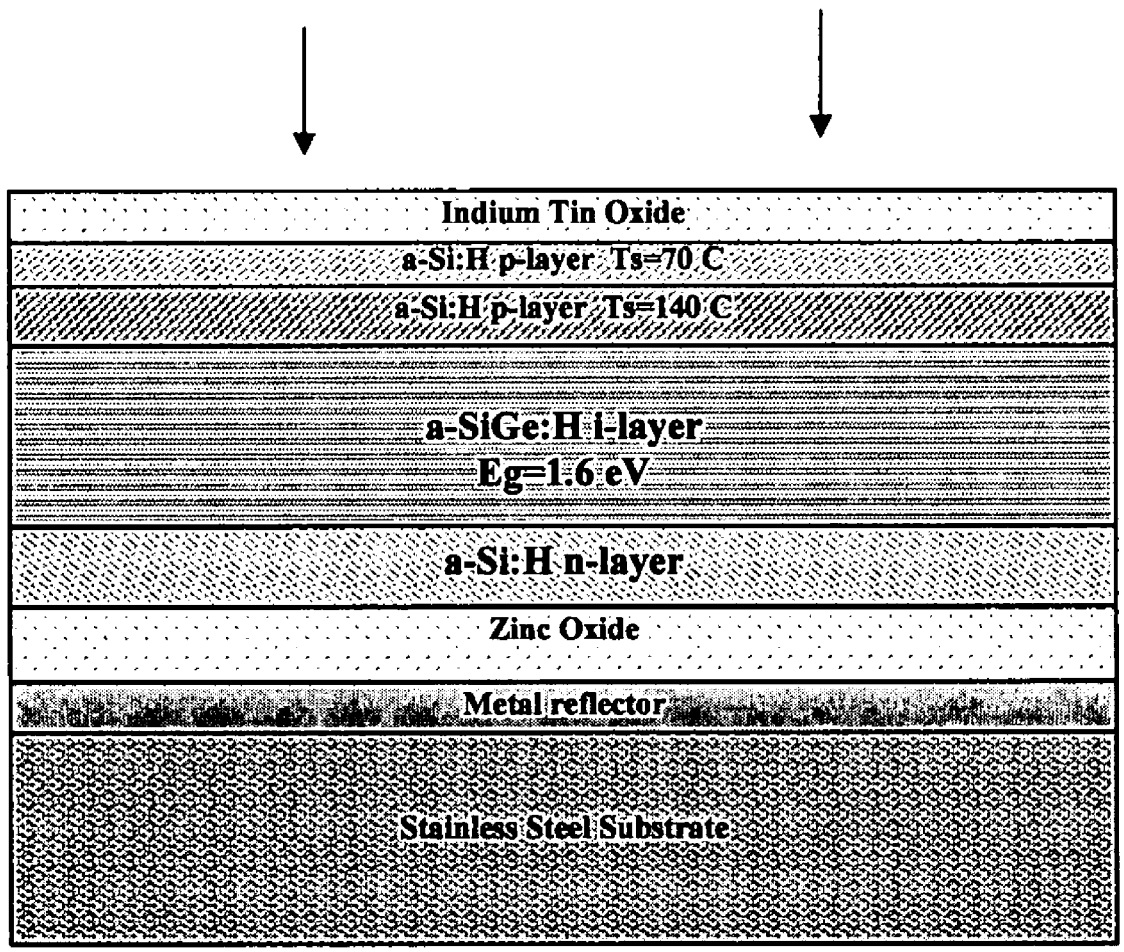
FIG. 5b is a schematic illustration of a single junction solar cell having the hybrid p-layer of the present invention.

FIG. 5b is a schematic illustration of a single junction solar cell having the hybrid p-layer of the present invention. FIG. 5c is a table showing the deposition conditions for comparative material A(GD904), comparative material B (GD907), Example 1 (GD908), and Example 2 (GD919). These devices use heavily doped n-type interface layer at the n-ZnO interface, and a heavily doped p-type interface layer at the p-ITO interface to improve the device FF.

An amorphous silicon-containing thin film semiconductor layer forms a single junction solar cell. The amorphous silicon semiconductor solar cell comprises a p-i-n amorphous silicon thin film semiconductor with a bandgap ranging from about 1.4 eV to 1.75 eV, usually to 1.6 eV. The amorphous silicon semiconductor material can comprise: hydrogenated amorphous silicon, hydrogenated amorphous silicon carbon or hydrogenated amorphous silicon germanium. A second positively doped (p-doped) amorphous silicon-containing sub p-layer is connected to the ITO layer of the front contact. A first positively doped (p-doped) amorphous silicon-containing p-layer is connected to the second sub p-layer. The first and second sub p-layers can be positively doped with diborane ($B_2H_6$), $BF_3$ or other boron-containing compounds. An amorphous silicon-containing, undoped, active intrinsic i-layer is deposited upon, positioned between and connected to the p-layer and a n-type amorphous silicon-containing layer. The n-layer is positioned on the i-layer and can comprise amorphous silicon carbon or amorphous silicon negatively doped with phosphine ($PH_3$) or some other phosphorous-containing compound.

In certain embodiments, the substrate may be made of a single substance conductive material, or formed with a conductive layer on a support composed of an insulating material or conductive material. The conductive materials may include, for example, metals such as NiCr, stainless steel, Al, Cr, Mo, Au, Nb, Ta, V, Ti, Pt, Pb, Sn, and alloys thereof. Also, it is to be understood that suitable insulating materials can include glass, ceramics, papers, and synthetic resins such as polyester, polyethylene, polypropylene, polystyrene, polyamide, polycarbonate, cellulose acetate, polyvinyl chloride, polyvinylidene on at least one surface thereof, and a semiconductor layer of the present invention is formed on the surface having the conductive layer formed thereon. For example, when the support is glass, a conductive layer composed of a material such as $SnO_2$, NiCr, Al, Ag, Cr, Mo, Ir, Nb, Ta, V, Ti, Pt, Pb, $In_2O_3$, ITO ($In_2O_3+SnO_2$), ZnO, or an alloy thereof is formed on the surface of the glass; for a synthetic resin sheet such as polyester film, a conductive layer composed of a material such as NiCr, Al, Ag, Pb, Zn, Ni, Au, Cr, Mo, Ir, Nb, Ta, V, Tl, Pt, or an alloy thereof is formed on the surface; and for stainless steel, a conductive layer composed of a material such as NiCr, Al, Ag, Cr, Mo, Ir, Nb, Ta, V, Ti, Pt, Pb, $In_2O_3$ ITO ($In_2O_3+SnO_2$), ZnO, or an alloy thereof is formed on the surface. The thickness of the substrate may be appropriately determined so as to be able to form photovoltaic elements as desired, but when the photovoltaic element is required to have flexibility, the substrate can be made as thin as possible within the range of sufficiently exhibiting the support function.

Doped Layers (p-Layer, n-Layer)

The base material of the doped layer(s) is composed of non-single crystalline silicon type semiconductor. Examples of the amorphous (abbreviated as a-) silicon type semiconductor include a-Si, a-SiGe, a-SiC, a-SiO, a-SiN, a-SiCO, a-SiON, a-SiNC, a-SiGeC, a-SiGeN, a-SiGeO, a-SiCON, and a-SiGeCON.

i-Layer

In the photovoltaic material of the present invention, the i-layer may be made of amorphous silicon type semiconductor, whether slightly p-type or slightly n-type. Examples of the amorphous silicon type semiconductor include a-Si, a-SiC, a-SiO, a-SiN, a-SiCO, a-SiON, a-SiNC, a-SiCON, a-SiGe, a-SiGeC, a-SiGeO, a-SiGeN, a-SiCON, a-SiGeNC, and a-SiGeCON.

Transparent Electrode

The transparent electrode may be suitably made of a material such as indium oxide ($In_2O_3$), tin oxide ($SnO_2$), or ITO ($In_2O_3+SnO_2$), to which fluorine may be added. The deposition of the transparent electrode is optimally performed by a suitable deposition method such as sputtering or vacuum vapor deposition. The vapor deposition sources suitable for depositing the transparent electrode by vacuum deposition include metallic tin, metallic indium, and indium-tin alloy.

While the photovoltaic element of the pin structure has been described above, the present invention is also applicable to the photovoltaic elements having a laminated pin structure such as a pinpin structure or a pinpinpin structure, or to photovoltaic elements having a laminated nip structure such as an nipnip structure or an nipnipnip structure. In certain embodiments, the benefit is the greatest for use as the top p-layer in a multijunction solar cell.

The photoelectric conversion element according to the present invention will be described below in detail, exemplifying solar cells or photosensors, to which the present invention is not limitative.

First, a substrate was fabricated. A stainless steel substrate having a desired thickness was cleaned and dried. A light reflection layer of a suitable reflective material such as Ag was formed on the surface of the stainless substrate at room temperature, and then a transparent conductive layer of ZnO was formed thereon using a suitable deposition method such that fabrication of the substrate was completed.

The photovoltaic element and method according to the present invention is described in detail exemplifying a solar cell for photosensors for which the present invention is not limitative.

EXAMPLE

The solar cell device structure is SS/back-reflector/a-Si n-layer/n-i buffer/a-SiGe absorber i-layer/i-p buffer/a-Si based p-layer/ITO. The a-SiGe absorber layers were deposited using a gas mixture of disilane, germane and hydrogen with a varying germane to disilane ratio and a hydrogen dilution of 5-100. The illumination I-V measurement was taken under a Xe lamp solar simulator. Quantum efficiency (QE) measurement was made in the range of 350-900 nm using a Xe lamp. Light soaking was done under AM1.5 light from a metal halide lamp for 1000 hours.

Figure 6A:
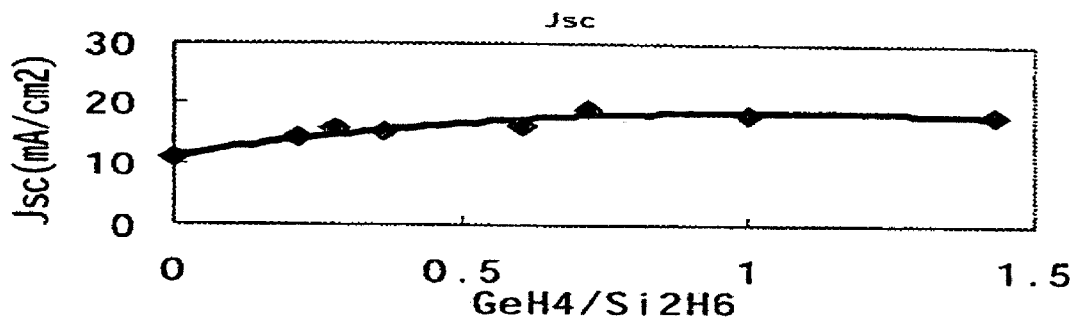
FIGS. 6a, 6b and 6c are graphs showing: the dependency of the short circuit ($J_{SC}$) (FIG. 6a); the open circuit voltage ($J_{OC}$) (FIG. 6b); and efficiency (EFF) (FIG. 6c) of n-i-p a-Si—Ge solar cells of GeH$_4$ fractions.
Figure 6B:
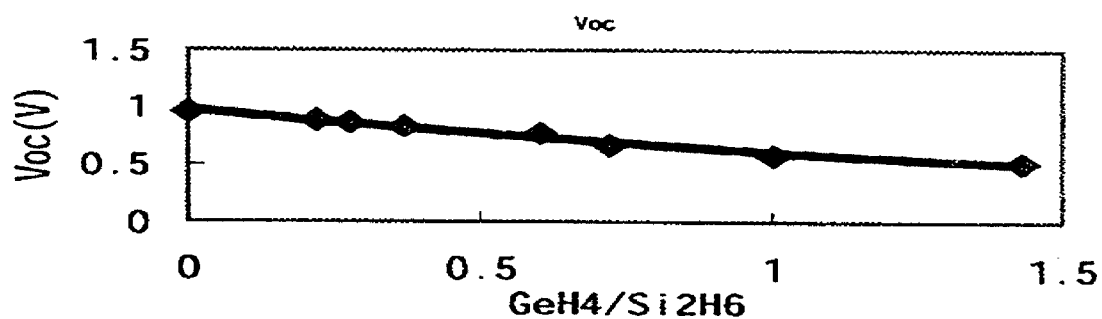
Figure 6C:
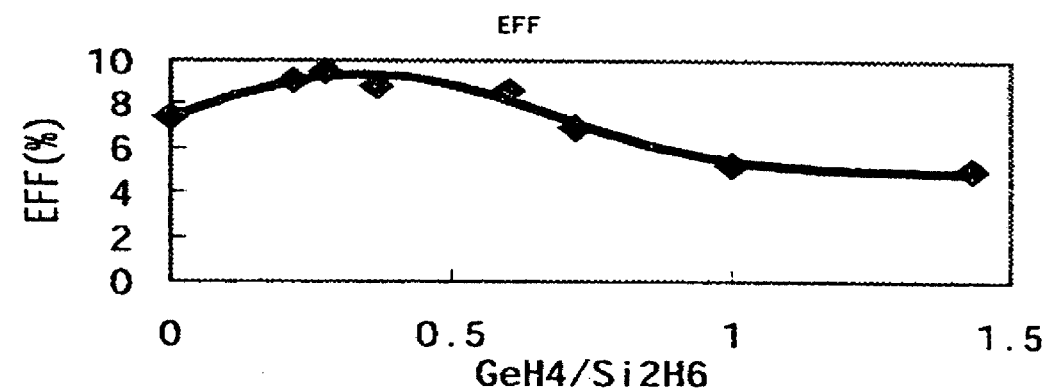

FIGS. 6a, 6b and 6c show the short circuit current ($J_{sc}$) open circuit voltage ($V_{oc}$), and the conversion efficiency ($\eta$) of n-i-p a-SiGe solar cells deposited on SS as a function of the [$GeH_4$]/[$Si_2H_6$] ratio in the reaction gas, respectively. The solid lines in these figures are used only for guiding eyes. It is seen that with increasing $GeH_4$ fraction, $J_{sc}$ increases, whereas $V_{oc}$ decreases, as a result $\eta$ reaches a maximum at an intermediate $GeH_4/Si_2H_6$ ratio of about 0.3, before decreasing with further increasing $GeH_4/Si_2H_6$ ratio. This intermediate value of $GeH_4/Si_2H_6$ ratio is close to what is used for the i-layer in the middle cell of standard triple-junction solar cells.

An optimized p-layer ideal for wide bandgap a-Si solar cell is not appropriate for intermediate bandgap a-SiGe solar cells since it leads to either a low $V_{oc}$ or a poor fill factor. These devices show not only the decay of FF, but also anomalous rollover behaviors of the illuminated I-V characteristics, caused by the un-optimized p-layer, as shown in FIGS. 2a and 2b.

The above detailed description of the present invention is given for explanatory purposes. It will be apparent to those skilled in the art that numerous changes and modifications can be made without departing from the scope of the invention. Accordingly, the whole of the foregoing description is to be construed in an illustrative and not a limitative sense, the scope of the invention being defined solely by the appended claims.

I claim:

1. A method for manufacturing a solar cell comprising the steps of:
   (i) providing a transparent substrate;
   (ii) depositing a transparent conducting oxide layer on the transparent substrate;
   (iii) depositing a second sub-p-layer on the transparent conducting oxide layer at a second temperature;
   (iv) depositing a first sub-p-layer on the second sub-p-layer at a first temperature that is different from the second temperature;
   (v) depositing an i-layer on the first sub-p-layer; and
   (vi) depositing a n-type layer on the i-layer
   wherein the second sub-p-layer is deposited onto the transparent conducting oxide layer at about 70° C. and at a thickness in the range of about 0.005 microns to about 0.02 microns, and wherein the first sub-p-layer is deposited onto the second sub-p-layer at about 140° C. and at a thickness in the range of about 0.001 microns to about 0.004 microns.

2. The method of claim 1, wherein during the i-layer deposition, a $GeH_4$ to $Si_2H_6$ ratio provides a Ge content sufficient for forming a single-junction solar cell.

3. The method of claim 1, wherein a ratio of hydrogen dilution to a deposition gas of about 5-100 is used to form the i-layer.

4. The method of claim 1, wherein the transparent substrate comprises glass or plastic.

5. The method of claim 1, wherein the first and second sub-p-layers are deposited by a chemical vapor deposition process.

6. The method of claim 5, wherein the chemical vapor deposition process comprises plasma enhanced chemical vapor deposition.

7. The method of claim 6, in which the plasma enhanced chemical vapor deposition comprises radio frequency plasma enhanced chemical vapor deposition.

8. The method of claim 1, wherein the first sub-p layer and the second sub-p-layer are selected from hydrogenated amorphous silicon, hydrogenated amorphous carbon, and hydrogenated amorphous silicon germanium.

9. The method of claim 8, wherein the i-layer comprises hydrogenated amorphous silicon germanium having a bandgap ranging from about 1.4 e-V to 1.6 e-V, and wherein the first and second sub p-layers comprise amorphous silicon with a bandgap of around 1.6 e-V.

10. The method of claim 6, wherein the plasma enhanced chemical vapor deposition is by at least one of the following: cathodic direct current glow discharge, anodic direct current glow discharge, radio frequency glow discharge, very high frequency (VHF) glow discharge, alternate current glow discharge, or microwave glow discharge at a pressure ranging from about 0.5 to about 5 TORR with a dilution ratio of dilutant to feedstock (deposition gas) ranging from about 5:1 to about 200:1.

11. The method of claim 1, wherein the second temperature at which the second sub-p-layer is deposited is lower than the first temperature at which the first sub-p-layer is deposited.

12. The method of claim 1, wherein a junction formed between the first sub-p-layer and the i-layer has a current-voltage relationship where the rate of change of the current-voltage relationship is one of at least a constant or an increasing rate of change.

13. The method of claim 1, wherein the i-layer comprises amorphous silicon germanium ($a\text{-}Si_{(1-x)}Ge_x$:H), and the first and second sub-p-layers are each comprised of nanocrystalline silicon.

14. A method for manufacturing a solar cell comprising the steps of:
(i) providing a transparent substrate;
(ii) depositing a transparent conducting oxide layer on the transparent substrate;
(iii) depositing a second sub-p-layer on the transparent conducting oxide layer at a second temperature;
(iv) depositing a first sub-p-layer on the second sub-p-layer at a first temperature that is different from the second temperature, wherein the second sub-p-layer is formed from the same material as the first sub-p-layer;
(v) depositing an i-layer on the first sub-p-layer; and
(vi) depositing a n-type layer on the i-layer
wherein the second temperature is about 70° C. and the first temperature is about 140° C.

15. The method of claim 14, wherein the first and second sub-p-layers are comprised of nano-crystalline silicon.

16. The method of claim 14, wherein the second sub-p-layer has a transparency greater than the first sub-p-layer.

17. The method of claim 14, wherein there is a minimal mismatch between the bandgap of the first sub-p-layer and the bandgap of the i-layer.

18. The method of claim 14, wherein the first sub-p-layer has a first thickness and the second sub-p-layer has a second thickness that is different from the first thickness.

19. The method of claim 16, wherein the first thickness is in the range of about 0.001 microns to about 0.004 microns, and the second thickness is in the range of about 0.005 microns to about 0.02 microns.

20. A method for manufacturing a solar cell comprising:
(i) providing a transparent substrate;
(ii) depositing a transparent conducting oxide layer on the transparent substrate;
(iii) depositing a second sub-p-layer comprised of nano-crystalline silicon on the transparent conducting oxide layer at a second temperature;
(iv) depositing a first sub-p-layer comprised of nano-crystalline silicon on the second sub-p-layer at a first temperature that is different from the second temperature;
(v) depositing an i-layer on the first sub-p-layer; and
(vi) depositing an n-type layer on the i-layer
wherein the second temperature is about 70° C. and the first temperature is about 140° C.

21. The method of claim 20, wherein the second temperature at which the second sub-p-layer is deposited is lower than the first temperature at which the first sub-p-layer is deposited.

22. The method of claim 20, wherein the second sub-p-layer has a transparency greater than the first sub-p-layer.

23. The method of claim 20, wherein there is a minimal mismatch between the bandgap of the first sub-p-layer and the bandgap of the i-layer.

24. The method of claim 20, wherein the first sub-p-layer has a first thickness and the second sub-p-layer has a second thickness that is different from the first thickness.

25. The method of claim 24, wherein the first thickness is in the range of about 0.001 microns to about 0.004 microns, and the second thickness is in the range of about 0.005 microns to about 0.02 microns.

26. The method of claim 20, wherein a junction formed between the first sub-p-layer and the i-layer has a current-voltage relationship where the rate of change of the current-voltage relationship is one of at least a constant or an increasing rate of change.

27. A method for manufacturing a solar cell comprising:
(i) providing a transparent substrate;
(ii) depositing a transparent conducting oxide layer on the transparent substrate;
(iii) depositing a second sub-p-layer comprised of nano-crystalline silicon on the transparent conducting oxide layer at a second temperature;
(iv) depositing a first sub-p-layer comprised of nano-crystalline silicon on the second sub-p-layer at a first temperature that is different from the second temperature;
(v) depositing an i-layer on the first sub-p-layer; and
(vi) depositing an n-type layer on the i-layer;
wherein the second sub-p-layer is deposited onto the transparent conducting oxide layer at about 70° C. and at a thickness in the range of about 0.005 microns to about 0.02 microns, and
wherein the first sub-p-layer is deposited onto the second sub-p-layer at about 140° C. and at a thickness in the range of about 0.001 microns to about 0.004 microns.

* * * * *